Oct. 31, 1961　　R. F. RUTZ　　3,007,090

BACK RESISTANCE CONTROL FOR JUNCTION SEMICONDUCTOR DEVICES

Filed Sept. 4, 1957　　2 Sheets-Sheet 1

INVENTOR.
RICHARD F. RUTZ
BY *Alvin J. Riddles*
ATTORNEY

Oct. 31, 1961 R. F. RUTZ 3,007,090

BACK RESISTANCE CONTROL FOR JUNCTION SEMICONDUCTOR DEVICES

Filed Sept. 4, 1957 2 Sheets-Sheet 2

United States Patent Office 3,007,090
Patented Oct. 31, 1961

3,007,090

BACK RESISTANCE CONTROL FOR JUNCTION SEMICONDUCTOR DEVICES

Richard F. Rutz, Fishkill, N.Y., assignor to International Business Machines Corporation, New York, N.Y., a corporation of New York Filed Sept. 4, 1957, Ser. No. 681,986
18 Claims. (Cl. 317—235)

This invention relates to semiconductor devices and in particular to a control of the back resistance of junction semiconductor devices.

In a junction semiconductor device, under conditions of operation, a very high field is present at each junction due to the fact that most voltage differences present in the device appear across a physically small region of the semiconductor crystal which forms the body of the device. As a result of this high field, small quantities of contaminating agents in places where these junctions appear at the surface may operate to cause leakage currents which can appreciably affect the back resistance of the junction, and, if these contaminating agents happen to be present in sufficient quantities, an effective short circuit across the junction may result. As a result of the effect of these contaminating agents, elaborate cleaning and encapsulation techniques are employed in the art but even when the device is encapsulated under the best conditions that the present state of the art can provide, these contaminants are still present in sufficient quantity to influence performance and their presence causes deterioration of performance characteristics as the device becomes older. In circuit design, using semiconductor devices, a term called "End of Life" has been adopted which defines a minimum allowable point, in the operating characteristics of a semiconductor device, to which the presence of these contaminating agents may reduce the back resistance of the device before the device is considered unsatisfactory for circuit application.

What has been discovered is that a high resistance, that is a part of the semiconductor crystal structure, may be built into the device in series or in parallel with a junction of the structure, and which, will have the effect of limiting the change in back resistance due to contaminants in the electric field associated with the junction.

A primary object of this invention is to provide a stabilized back resistance semiconductor device.

Another object of this invention is to provide a reduced electric field associated with a junction of a semiconductor device appearing at the surface thereof.

Still another object of this invention is to provide a semiconductor device, the back resistance of which does not deteriorate with age.

Still another object of this invention is to provide a stabilized semiconductor device requiring little or no encapsulation.

A related object of this invention is to provide a junction transistor with a junctionless surface.

Another object of this invention is to provide a reduced electric field at the surface of a junction transistor.

Still another related object of this invention is to provide a junctionless surface semiconductor diode.

Still another related object of this invention is to provide a method of reducing carrier recombination at the surface of a semiconductor device.

Other objects of the invention will be pointed out in the following description and claims and illustrated in the accompanying drawings, which disclose, by way of example, the principle of the invention and the best mode, which has been contemplated, of applying that principle.

Figure 1:
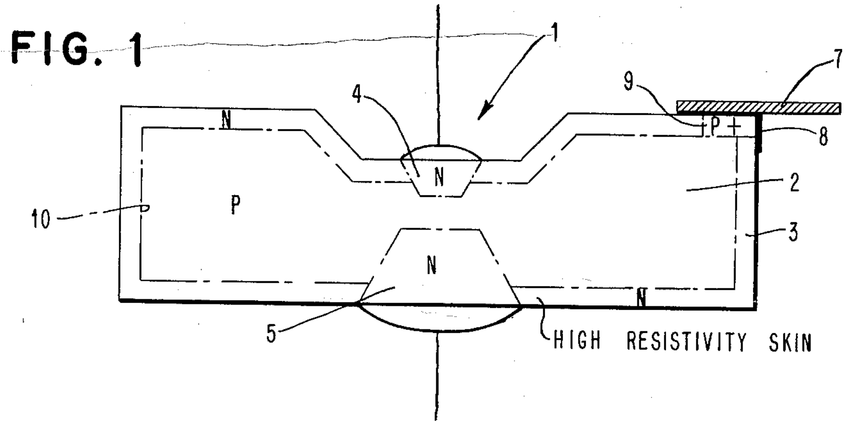
FIG. 1 is a junctionless surface NPN transisitor illustrating the principle of this invention.

The electric field associated with a PN junction in a semiconductor device is dependent upon the ratio of resistivities of the semiconductor material on each side of the junction and on the gradient of the resistivities as each resistivity approaches intrinsic in the vicinity of the juncton. In the higher frequency semiconductor devices, it is often necessary to provide physically small semiconductor body volumes and to impose limitations on the resistivity of some of the material associated with the junctions, such that an advantageous resistivity grading of these junctions is becoming increasingly difficult to incorporate into a device. Since the main difference in potential occurring in the semiconductor device takes place across these junctions, an electric field which is a measure of the difference in potential per unit linear distance may become extremely high and where the junction appears at the surface of the semiconductor crystal, any foreign body, however small, that appears in this field may result in change in the potential gradient thereof, in such a manner, as to cause breakdown and a leakage current. If the quantity of foreign material is sufficiently large, the leakage current may exceed, or become an appreciable part of, the signal magnitude thereby rendering the device less valuable or completely useless depending upon the degree of leakage. In order to combat this situation, a thin, very high resistivity semiconductor skin of one conductivity type may be applied to a semiconductor device so as to either completely envelope the device thereby actually providing a circuit path through the high resistance around the PN junction thereof, or, in the alternative, the high resistivity skin may be applied, in such a manner, as to be in series with the PN junction in a structure, to be later explained, thereby reducing the strength of the electric field where it appears at the surface.

When such a construction, as that of this invention, is employed, the back resistance of the junction will be that of the high resistance skin the case where the device is completely enveloped. Thus, while the value of the high resistance skin does not approach the back resistance value of the junction itself, still this value, since there is no exposed high electric field, is not subject to change due to the presence of foreign bodies in the electric field, and, since it is finite known value, it may be considered in circuit design using the device. In the application of this invention to semiconductor devices, the establishment of a reduced but definitely established and non-deteriorating back resistance value for design purposes, may be considered to be analogous to the approach used in the electronic industry of the shielding of leads to control distributed capacitance by establishing this capacitance at a fixed value which may be considered in design. Since the bulk properties of a semiconductor crystal do not change, appreciably with time, devices such as transistors and diodes made, employing this invention, will have electrical characteristics which remain fixed as time goes on, and which, due to the absence of the intense electric field at the surface of the devices now available in the art will not require elaborate encapsulation and cleaning operations to insure long life and performance.

Referring now to FIG. 1, a junction transistor 1, selected for purposes of illustration as an NPN type, is shown comprising a P type semiconductor crystal body 2 serving as the base region having thereon a thin high resistivity N type skin 3. An emitter connection 4 is made to the device through the skin 3 and the collector connection 5 also penetrates through the skin 3 to the P type crystal 2. An ohmic base connection 7 is made as by soldering 8 through a low resistance P type inclusion 9 to both the P type body 2 and to the high resistivity skin 3.

The transistor of FIG. 1 may be made by a number of techniques standard in the art, an illustrative one of which is as follows. A P type semiconductor crystal, for example of germanium, having arbitary resistivity value, for example, of 6 ohm centimeters is converted by the technique of gaseous diffusion, to N type high resistivity semiconductor material, as by diffusing a very small quantity of N type impurity, for example arsenic, to a shallow depth into the P type crystal. Since the resistivity of the semiconductor crystal 2 is determined by the net quantity of N conductivity type impurities over P conductivity type impurities in the region of the crystal, the introduction of a sufficiently large quantity of these N conductivity type impurities to predominate will serve to provide a region of N conductivity type on the surface of the crystal 2. The magnitude of the net quantity of predominating impurities determines the resistivity of the crystal and since the diffusion is conducted from the surface into the crystal, a gradient of resistivity will be produced in the N conductivity type region such that the resistivity will be lower at the surface and will increase to intrinsic in the vicinity of a PN junction, shown in FIG. 1 as element 10.

The providing of a semiconductor device with a thin skin of opposite conductivity type having a gradient of resistivity from a value that is low at the surface to a value that is higher at the body of the device serves further to provide an electric field, in connection with the surface of the crystal to prevent minority carriers from reaching the surface and thereby to reduce one of the major losses in semiconductor device operation, known as surface recombination. This feature, itself, is of considerable advantage and results, for example, in devices with greater amplification factors. The emitter 4 and collector 5 rectifying contacts may now be made to the crystal 2 by the alloying technique, well known in the art, wherein a quantity of donor impurity; such as, arsenic, antimony or selenium is alloyed through the use of a carrier metal, such as lead, through the thin N region 3 and into the P region 2 of the crystal. Since the lead easily dissolves the germanium, the N regions can penetrate to a desired depth into the P type body 2. For transistor action, the distance between emitter 4 and collector 5 must be within the diffusion distance of the average carrier during the carrier lifetime of the semiconductor material and this may conveniently be done to form the structure, illustrated in FIG. 1, by controlling the temperature, duration and size of quantities of an alloy of lead and antimony placed in contact with opposite sides of a thin wafer. Through the controlled alloying technique known in the art, the two rectifying contacts are brought within the required distance of each other. An ohmic contact, such as 7 in FIG. 1, may be applied to the P type crystal 2, through again using the alloying technique wherein a P conductivity type directing impurity, such as, indium, is employed. In this operation, the fused indium alloys through the N region 3 forming junction barriers therewith and into the P region 2 forming an ohmic contact therewith. An external connection 7 may then be applied, for example, by soldering. Due to the high resistivity of the N type skin 3, the contact 7 may be permitted to form a circuit path across the junctions between the P type region 9 and the skin 3, as illustrated in FIG. 1.

In operation, the effect of the high resistance skin of this invention is to provide a reduced, but specifically established, back resistance value for each of the emitter and collector junctions.

Figure 2:
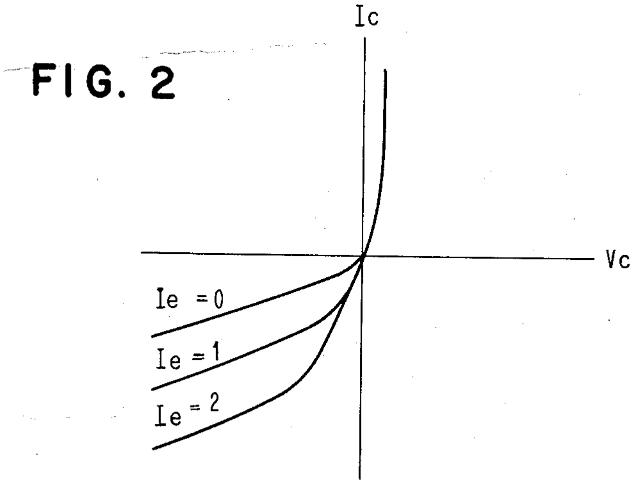
FIG. 2 is the family of collector characteristic curves for the transistor of FIG. 1.

Referring now to FIG. 2, the collector characteristics of a typical transistor, such as shown in FIG. 1, employing the principle of this invention, are presented. From these curves, it may be seen that the effect of the high resistivity skin is to change the slope of the curves in the back resistance direction, such, that the current, flowing in the off condition ($Ie=0$) through the collector junction (this current is commonly known in the art as $I_{C0}$) would be a finite value represented by the collector potential flowing through the impedance of the high resistivity skin 3. The slope of the curves, due to the reduced resistance value in the back direction, is greater than with the junction alone. While only the collector characteristics of the transistor of FIG. 1 have been shown, it will be apparent to one skilled in the art, that a similar set of characteristics may be seen for the emitter of the transistor of FIG. 1. It will further be apparent that since the phenomenon of surface recombination is a substantial factor in the losses encountered in the operation of the semiconductor device, the high resistivity skin 3 of the transistor of FIG. 1 having a gradient of resistivity, such, that an electric field is set up operating to prevent carriers from reaching the surface of the crystal will have the effect of increasing the amplification factor, known in the art as alpha, of the transistor or the efficiency of any semiconductor device employing the principle of this invention.

The effect of this field may be illustrated by considering its contribution to the amplification factor, alpha, of a junction transistor. The alpha, symbolized $\alpha$, of such a transistor is known in the art to be the product of three performance factors that are a part of the device. These factors are: the emitter injection efficiency, gamma, symbolized $\gamma$; the minority carrier transport factor, beta, symbolized $\beta$ and the intrinsic amplification factor of the collector, symbolized $\alpha^*$. The factor $\beta$ is a measure of the number of injected carriers that reach the collector and one of the two main items that influence its value are surface and bulk recombination of the carriers in the semiconductor material. In good semiconductor material, the bulk recombination is very small and is nearly negligible, whereas, the surface recombination is the item most influencing the value of $\beta$. The effect of the field associated with the high resistivity skin employed in connection with this invention is to urge minority carriers away from the surface, prevent surface recombination and hence, improve $\beta$.

Figure 3:
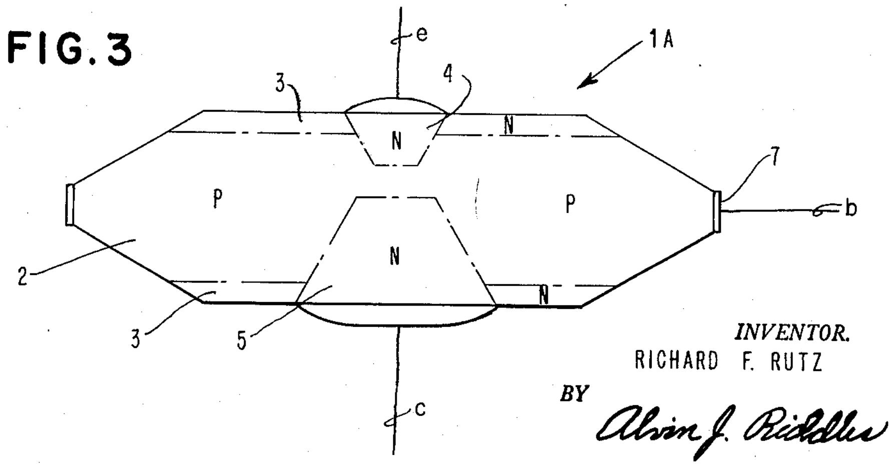
FIG. 3 is a junction transistor having a reduced electric field at the surface.

Referring now to FIG. 3, the high resistivity skin, described in connection with FIG. 1 and FIG. 2 may be applied to a different structure, as is shown in FIG. 3. In FIG. 3, where like regions perform like functions, the same reference numerals have been used as those of FIG. 1. In FIG. 3, a transistor 1A is shown having a P conductivity type body 2 and an N conductivity type high resistivity skin 3 on most of the surface of the body. An emitter connection 4 is applied as by alloying and a collector connection 5 by the same technique. In the structure of FIG. 3, the crystal is cut in such a manner that the high resistivity skin 3 is placed in series with any short circuit which might occur as a result of the junction appearing at the surface. The effect of this is to limit current flow due to the breakdown of junctions at the surface and to thereby reduce the electric field present in the vicinity of these junctions. Since there is no current path through the high resistivity skin between the emitter 4 and the collector 5, except by current that leaks through the junctions, no appreciable change in the output characteristic will result in the device of FIG. 3 but a sharp reduction in the increase in $I_{C0}$ which is normally experienced with age of a semiconductor device will be exhibited by the device of FIG. 3. Because $I_{C0}$ for the most part must now flow through the high resistance of the skin 3, this lowers the field where the junction reaches the surface.

Figure 4:
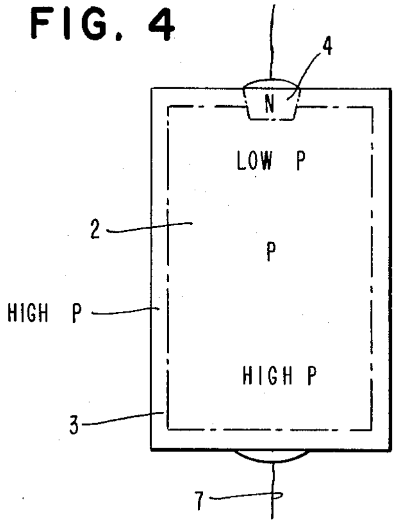
FIG. 4 is a junctionless surface diode illustrating the principles of this invention.
Figure 5:
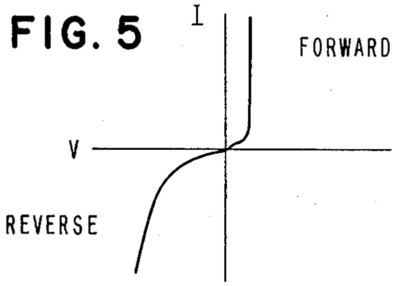
FIGS. 5, 6 and 7 are characteristic curves of parts of the diode of FIG. 4.
Figure 6:
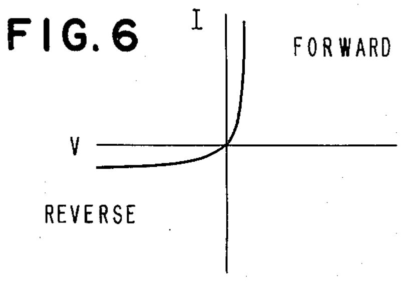
Figure 7:
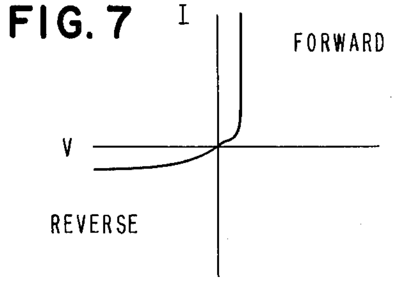

Referring now to FIG. 4, still another type of semiconductor structure employing the principle of this invention is illustrated. The structure of FIG. 4 is a semiconductor diode wherein a body 2 of P conductivity type material having a gradient of resistivity (symbolized $\rho$) from a value that is low at an upper end to high at the opposite end is provided with a high resistivity N conductivity type skin 3, an alloyed injecting and collecting rectifying contact 4 is provided at the low resistivity portion of the body 2. An ohmic contact is provided to the injecting contact 4 and a base ohmic contact 7 is provided to the high resistivity N type skin 3 adjacent to the high resistivity end of the P type material 2. In order to understand the operation of the diode of FIG. 4, consider that the resistivity of the contact 4 and that of the low resistivity P type material 2 are sufficiently low, say in the vicinity of .01 ohm centimeter, that the junction, in connection with contact 4, when reversed biased will have an "avalanche breakdown" sufficiently low that this junction will present a very low resistance, regardless of the polarity of bias across it. The "avalanche breakdown" of a junction is established, in the art, as being controllable by the resistivities of the material on each side of the junction. In the high resistivity end of the diode, however, since both the N and P type regions are relatively high resistivity, say for example, 10 ohm centimeters, the breakdown when this part of the junction is reversed biased will be very high. This is illustrated in FIG. 5 wherein for the low resistivity end of the P type material 2, a low value of "avalanche breakdown" in the reverse direction, is illustrated. Similarly, in FIG. 6, for the high resistivity end of the P type material 2, the forward resistance will be determined by the bulk resistance of the material and the reverse resistance will show no evidence of "avalanche breakdown" in the normal operating range. The performance of this structure is illustrated in FIG. 7 which is a composite of the output characteristics of the individual parts, the curve illustrates that the forward resistance of the device is determined and kept desirably low by the construction in which the forward impedance of the several diodes that make up this structure are placed in parallel and the back resistance of the device will be dominated by the resistance of the covering N type skin and this value may be maintained quite high with appropriate geometry to be later described.

Figure 8:
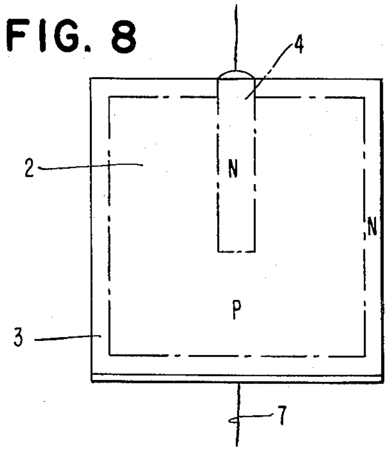
FIG. 8 is an illustration of another diode structure employing the principles of this invention.

Still another example of a semiconductor structure employing the principle of this invention is the diode of FIG. 8 where the P region 2 has no gradient of resistivity, the N skin, similar to that, previously illustrated in the preceding embodiments and the injecting and collecting connection 4 are made by proving an aperture, filling and fusing in an alloy material over a broad area so that extremely low forward resistances are achieved.

Figure 9:
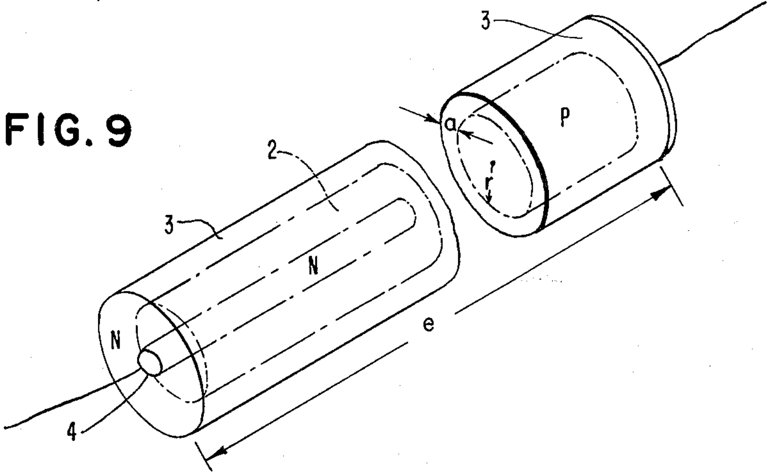
FIG. 9 is an illustration of a semiconductor body in an intermediate stage of manufacturing illustrating the fabrication of the high resistivity skin.

In order to establish proper perspective as to the physical sizes involved and the magnitude of the effect of the high resistivity skin, the construction of a diode is illustrated in FIG. 9.

Referring now to FIG. 9, considering, for example, if the diode of FIG. 8 were made in the form of a cylinder having a radius $r$ and the N skin having a thickness $a$ with the relationship, such that $r>a$. Assuming the length to be $l$ then the resistance R of the N type skin may be expressed by the following equations:

(1) $$R=\rho\frac{\text{length}}{\text{area}}$$

(2) $$R=\rho\frac{l}{2\pi ar}$$

or the above expression may be expressed in terms of:

(3) $$R=\frac{\rho}{2\pi a}\times\frac{l}{r}$$

Taking for example, the use of germanium semiconductor material with an arbitrarily assigned resistivity equal to $2\pi$ which in turn equals 6.3 ohm centimeters and then assigning a value to $a$ of $10^{-4}$ centimeters to insure ten or more impurity atoms along the radial direction, then, (4) $$R=10^4\times\frac{l}{r}\text{ ohms}$$

Thus, in order to have R equivalent to 1 megohm an $$\frac{l}{r}$$

ratio of 100 in the illustration of FIG. 9, would be required. It should here be pointed out that the value of R taken in parallel with the value of the bulk back resistance of a particular rectifying contact made to a device such as FIG. 9, will determine the back resistance of the rectifying contact in other words.

$$\text{Back resistance}=\frac{R+\text{Back resistance of rectifying contact}}{R\times\text{Back resistance of rectifying contact}}$$

It will be apparent for silicon or other semiconductor materials with higher energy levels between the valence and conduction bands, (.7 electron volt being the accepted value for germanium), $\rho$ for the skin layer could be chosen 100 times or more, greater than the $2\pi$ used for the germanium illustration above, resulting in much higher back resistance in a structure having the same dimensions, or, in other words the effect of the high resistivity skin on the back resistance of rectifying contacts would be less pronounced.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. An asymmetric conducting device comprising a semiconductor body of a particular conductivity type, at least, input and output electrodes operatively associated therewith, said body being provided with a high resistivity surface region of a conductivity type opposite to that of the conductivity type of said body surrounding and forming a current path between each of said input and output electrodes.

2. A transistor comprising a body of semiconductor material of a particular conductivity type, a first rectifying connection to one surface of said semiconductor body, a second rectifying connection to a second surface of said semiconductor body and a high resistivity region having a conductivity type opposite to that of said semiconductor body, said region substantially covering the surfaces of said semiconductor body, being integral with said semiconductor body and forming at least a portion of a surface current path between each of said input and output electrodes, and an ohmic base connection so said semiconductor body.

3. The transistor of claim 2 wherein said semiconductor material is germanium.

4. The transistor of claim 3 wherein said semiconductor body is P conductivity type.

5. The transistor of claim 3 wherein said semiconductor body is N conductivity type.

6. The transistor of claim 2 wherein said opposite conductivity type surface region is provided with a gradient of resistivity varying from a value which is low, at the surface, to a value which is higher adjacent to said body.

7. The transistor of claim 6 wherein said semiconductor material is germanium.

8. The transistor of claim 7 wherein said semiconductor body is P conductivity type.

9. The transistor of claim 7 wherein said semiconductor body is N conductivity type.

10. An asymmetric conducting device having a semiconductor body of a particular conductivity type, having two major surfaces and being provided with a gradient of resistivity varying from a value which is low, adjacent to one major surface, to a value which is higher, adjacent to the other major surface, a junction rectifying contact operatively associated with said first major surface of said body, a high resistivity opposite conductivity type region integral with and substantially covering said semiconductor body and an ohmic connection to said high resistivity region on said second major surface of said body.

11. The asymmetric impedance device of claim 10 wherein said region of opposite conductivity type is provided with a gradient of resistivity from a value which is low, at the surface, to a value which is higher, adjacent to said body.

12. The asymmetric conducting device of claim 11 wherein said semiconductor body is germanium.

13. The asymmetric conducting device of calim 12 wherein said particular conductivity type is P conductivity type.

14. The asymmetric conducting device of claim 12 wherein said particular conductivity type is N conductivity type.

15. A semiconductor diode comprising a semiconductor body of a particular conductivity type, an aperture in said body, a region of opposite conductivity type to said body substantially covering the surface of said aperture, a high resistivity region of the same conductivity type as the conductivity type of the surface of said aperture substantially covering said body, a first ohmic contact to said opposite conductivity type region in said aperture and a second ohmic contact to said high resistivity region remote from said first ohmic contact.

16. The diode of claim 15 wherein said region of high resistivity is provided with a gradient of resistivity from a value which is low, at the surface, to a value which is higher, adjacent said body.

17. The diode of claim 16 wherein said particular conductivity type semiconductor body is P conductivity type germanium.

18. The diode of claim 16 wherein said particular conductivity type semiconductor body is N conductivity type germanium.

References Cited in the file of this patent

UNITED STATES PATENTS

| | | |
|---|---|---|
| 2,561,411 | Pfann | July 24, 1951 |
| 2,666,814 | Shockley | Jan. 19, 1954 |
| 2,725,315 | Fuller | Nov. 29, 1955 |
| 2,740,076 | Mathews et al. | Mar. 27, 1956 |
| 2,770,761 | Pfann | Nov. 13, 1956 |
| 2,868,683 | Jochems et al. | Jan. 13, 1959 |
| 2,874,341 | Biondi et al. | Feb. 17, 1959 |
| 2,943,006 | Henkels | June 28, 1960 |